United States Patent
Rehm et al.

(10) Patent No.: US 6,442,041 B2
(45) Date of Patent: Aug. 27, 2002

(54) MCM—MLC TECHNOLOGY

(75) Inventors: Simone Rehm, Ehningen; Bernd Garden; Erich Klink, both of Schoenaich; Gisbert Thomke, Holzgerlingen, all of (DE); William F. Shutler, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/740,280

(22) Filed: Dec. 19, 2000

(30) Foreign Application Priority Data

Dec. 21, 1999 (DE) .......................... 991 25 461

(51) Int. Cl.⁷ .................. H05K 7/02; H05K 7/10; H05K 1/03; H05K 1/16
(52) U.S. Cl. .................. 361/760; 361/757; 174/255; 174/261
(58) Field of Search .................. 174/250–268, 174/36; 361/728, 735, 736, 739, 746, 748, 750, 751, 757, 760, 792–795; 438/15, 25, 26, 51, 106

(56) References Cited

U.S. PATENT DOCUMENTS

| 6,184,477 B1 | * | 2/2001 | Tanahashi | 174/261 |
| 6,229,085 B1 | * | 5/2001 | Gotoh | 174/35 |
| 6,278,148 B1 | * | 8/2001 | Watanabe | 257/296 |

* cited by examiner

Primary Examiner—David Martin
Assistant Examiner—Michael L. Lindinger
(74) Attorney, Agent, or Firm—Andrew J. Wojnicki, Jr.

(57) ABSTRACT

Disclosed is a multilayer electronics packaging structure, especially for use in a multi chip module. By forming an overlap of signal conductors by the respective mesh conductors, an improved shielding effect is achieved and coupling between signal conductors is reduced. By increasing the via punch pitch such that multiple wiring channels are formed between adjacent vias, wirability is improved and the number of signal distribution layers may be reduced. The new structure thus shows improved electrical properties over the state-of-the-art structures, combined with a cost reduction of about 35%.

9 Claims, 6 Drawing Sheets

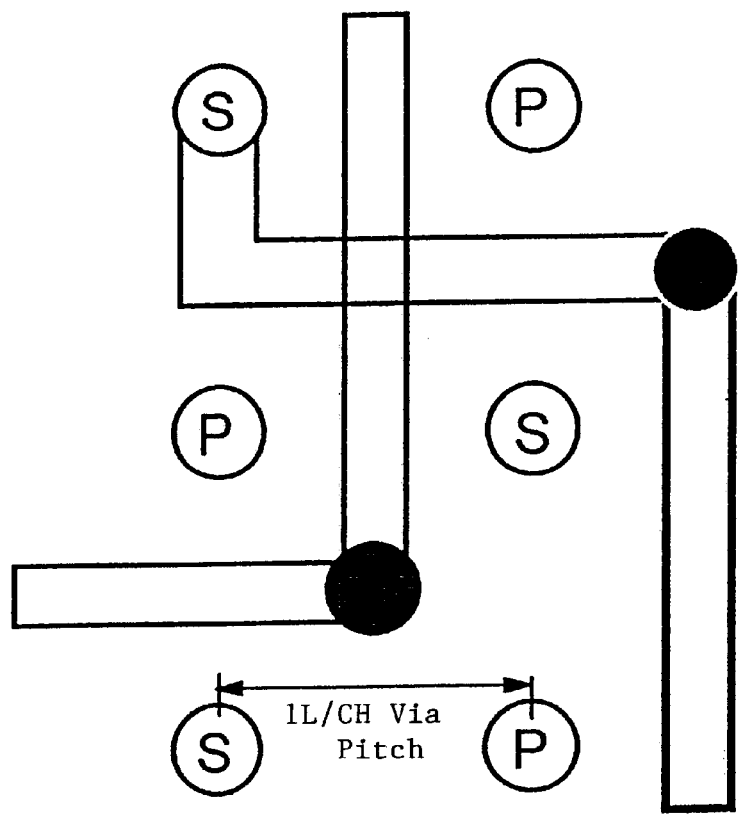
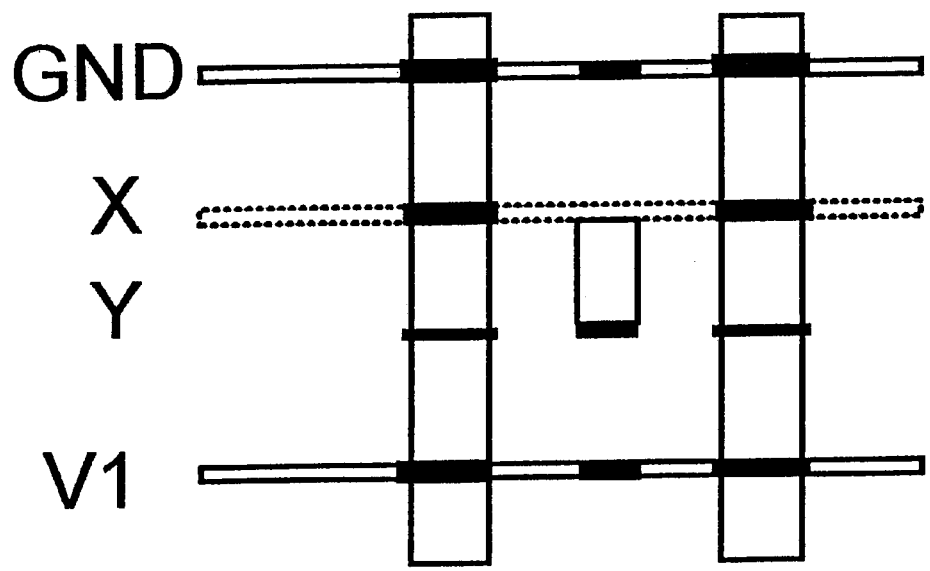
FIG. 1A    State of the Art

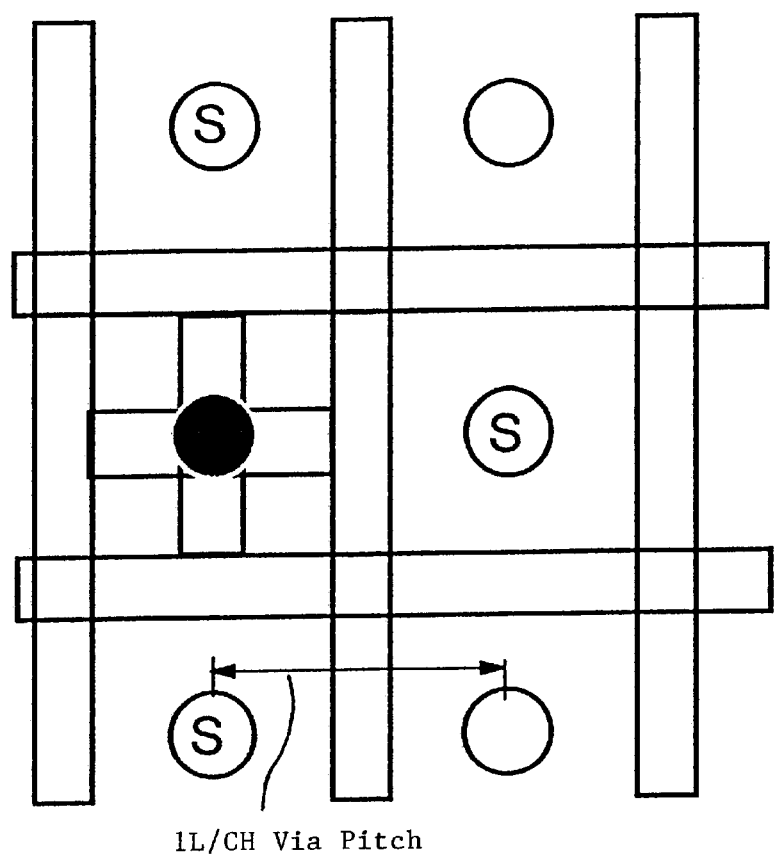
1L/CH Via Pitch
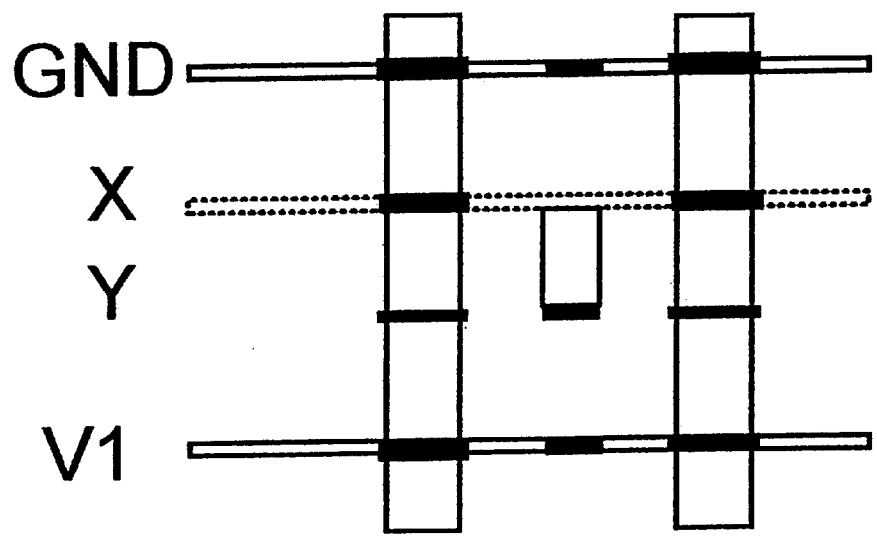
FIG. 1B  State of the Art

| Left | Right |
|---|---|
| L0T1 | TSM |
| L0B1 | JOG |
| L002 | V3.6 mesh / PLL-ext. / therm. |
| L003 | GND mesh |
| L004 | V1.8 mesh |
| L005 | V2.5 mesh |
| L006 | R1 |
| L007 | GND mesh |
| L008 | R2 |
| L009 | V1.8 mesh |
| L010 | R3 |
| L011 | GND mesh |
| L012 | R4 |
| L013 | V1.8 mesh |
| L014 | R5 |
| L015 | GND mesh |
| L016 | R6 |
| L017 | V1.8 mesh |
| L018 | R7 |
| L019 | GND mesh |
| L020 | X1 |
| L021 | Y1 |
| L022 | V2.5 mesh |
| L023 | X2 |
| L024 | Y2 |
| L025 | GND mesh |
| L026 | X3 |
| L027 | Y3 |
| L028 | V1.8 mesh |
| ... | ... |
| L049 | GND mesh |
| L050 | X11 |
| L051 | Y11 |
| L052 | V1.8 mesh |
| L053 | X12 |
| L054 | Y12 |
| L055 | GND mesh |
| L056 | X13 |
| L057 | Y13 |
| L058 | V2.5 mesh |
| L059 | V3.6 mesh / |
| L060 | GND mesh |
| L061 | V1.8 mesh |
| L062 | BSM |

FIG. 1C  Prior Art

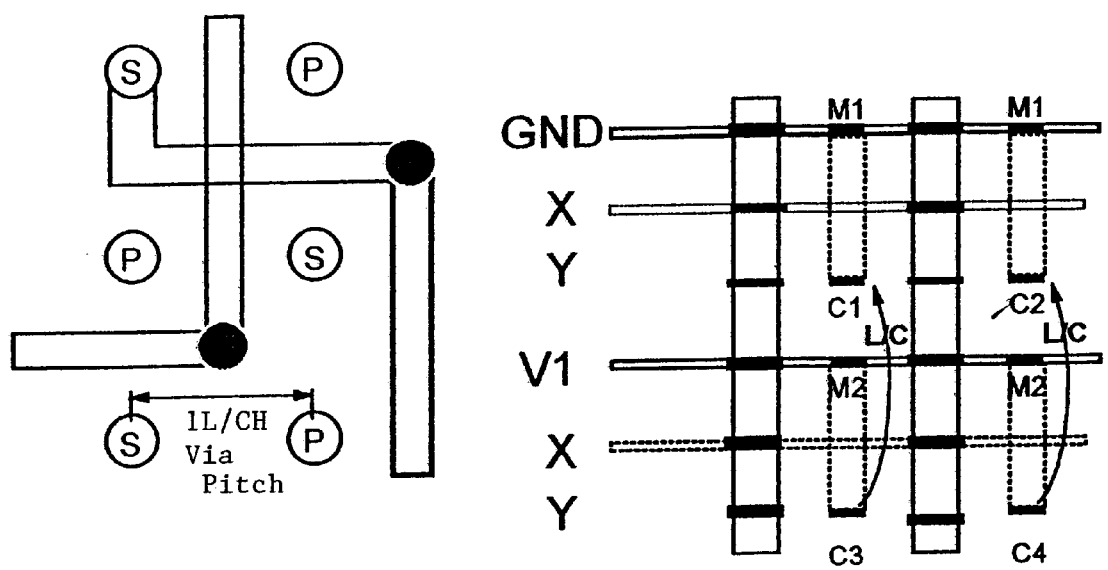
FIG. 2   State of the Art
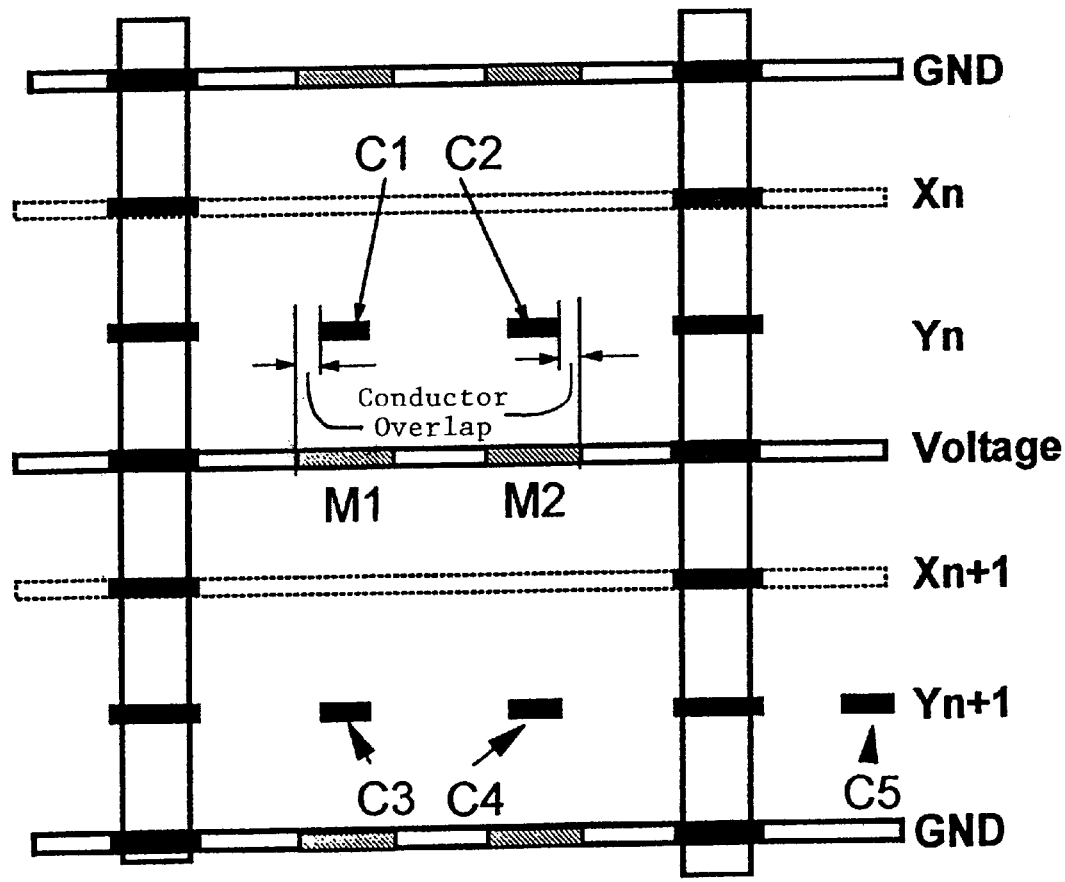
FIG. 4

| Left | Right |
|---|---|
| L0T | TSM |
| L0B | JOG |
| L002 | V3.6 mesh / PLL-ext. / therm. |
| L003 | V1.8 mesh |
| L004 | V2.5 mesh |
| L005 | GND mesh |
| L006 | R1 |
| L007 | V1.8 mesh |
| L008 | R2 |
| L009 | GND mesh |
| L010 | R3 |
| L011 | V1.8 mesh |
| L012 | R4 |
| L013 | GND mesh |
| L014 | X1 |
| L015 | Y1 |
| L016 | V2.5 mesh |
| L017 | X2 |
| L018 | Y2 |
| L019 | GND mesh |
| L020 | X3 |
| L021 | Y3 |
| L022 | V1.8 mesh |
| ⋮ | |
| L025 | GND mesh |
| L026 | X5 |
| L027 | Y5 |
| L028 | V1.8 mesh |
| L029 | X6 |
| L030 | Y6 |
| L031 | GND mesh |
| L032 | X7 |
| L033 | Y7 |
| L034 | V2.5 mesh |
| L035 | V3.6 mesh / |
| L036 | GND mesh |
| L037 | V1.8 mesh |
| L038 | BSM |

FIG. 3C

MCM— MLC TECHNOLOGY

PRIOR FOREIGN APPLICATION

This application claims priority from German patent application number 99125461.6 filed Dec. 21, 1999, which is hereby incorporated herein by reference in its entirety.

BACKGROUND OF THE INVENTION

1. Field of the Invention

The present invention relates to a novel multilayer ceramic module structure. More specifically, it relates to the design of multilayer ceramic multichip modules.

2. Description of Related Art

As VLSI circuits become more dense, there is a need in the art to have semiconductor packaging structures that can take full advantage of the density and speed provided by state of the art VLSI devices. Present day modules made of ceramic, typically multilayered ceramic modules, are normally mounted onto cards or boards, with cards or boards combined together to form the central processing unit (CPU) of a computer. The multilayer ceramic (MLC) modules typically have VLSI chips mounted on the top surface.

Multilayer modules are used for the packaging of electronic components, especially integrated circuit chips. Both single chip modules (SCM) and multi chip modules (MCM) are widely used. The most common type of such modules is the multilayer ceramic packaging module. In this type of module the layers consist of a ceramic or glass-ceramic material. However, other types of thickfilm technologies are known, such as glass epoxy and teflon.

The basic technology of multilayer modules was first described by A. J. Blodgett and D. R. Barbour, "Thermal Conduction Module: A High-Performance Multilayer Ceramic Package", IBM Journal of Research and Development 26 (1), pp. 30–36, January 1982, and by A. J. Blodgett, "Microelectronic Packaging", Scientific American, 249 (1), pp. 86–96, January 1983. The technology of multilayer modules is also described in "Microelectronics Packaging Handbook", edited by R. R. Tummala and E. J. Rymaszewski, New York, 1988, especially in Chapter 7 entitled "Ceramic Packaging", pp. 455–522.

As integrated circuit speeds and packaging densities increase, the importance of the packaging technology becomes increasingly significant. For example, as devices approach gigahertz speed, inductance effects in the package become more significant. Such inductance effects may arise from switching, for example, and are particularly problematic in power and ground leads. Inductance effects in the package can cause ground bounce, signal cross-talk and the like. Increasing circuit size and speed also impact the heat dissipation ability of the package.

Especially VLSI and ULSI chips are designed for high performance applications and are thus limited by noise. The noise is caused by a high number of simultaneously switching off-chip drivers (OCD noise) and by a high number of simultaneously switching latches and the associated logic gates (logic noise). Both noise sources impact and restrict the on-chip and off-chip performance and jeopardize the signal integrity. Both noise sources generate noise due to line-to-line coupling and due to the collapse of the voltage-ground (GND) system. It is known in the art to use on-module capacitors to stabilize the power system. Thereby a major noise reduction is achieved.

A multilayer ceramic fabrication process involves the formation of the green or unfired ceramic layers or sheets, the formation of the conductive paste, the screening of the conductive paste onto the green ceramic sheets and the stacking, laminating and firing of ceramic sheets into the final multilayer ceramic structure. These general processes are known in the art and are, e.g., described in the publication entitled "A Fabrciation Technique for Multilayer Ceramic Module", H. Kaiser et al, Solid State Technology, May 1972, pp. 5–40 and the U.S. Pat. No. 2,966,719 assigned to Park.

The ceramic green sheet is formed by weighing out the proper portions of the ceramic powder and glass frit, and blending the particles by ball or other milling techniques. The organic binder comprising the thermoplastic resin, plasticizer and solvents is then mixed and blended with the ceramic and glass powders on a ball mill. A slurry or slip is cast into a tape form by extruding or doctor blading. The cast sheet is then allowed to be dried of the solvent constituent in the binder system. After the tape is completely dried, it is then cut into working blanks or sheets; registration holes are formed in the blanks together with the via holes which are selectively punched in the working blanks. The via holes will eventually be filled with a conductive composition to allow for electrical connections from layer to layer in the multilayer ceramics structure.

FIGS. 1a to 1c describe the standard MCM-MLC technology. In FIG. 1a the wiring scheme is described. Between ground (GND) and voltage (V1) mesh planes the signal distribution layers (X, Y), also called "X/Y wiring area" are located. FIG. 1a shows that on a given via pitch the signal and power vias (S, P) are punched through all multilayers of the MCM. The via punch pitch is defined by the manufacturing yield. As an example for today's MCM-MLC technologies, the via punch pitch is given as 450 $\mu$m.

The wiring directions of the two signal distribution layers X, Y are orthogonal to each other in order to minimize vertical coupling. Only one single signal line fits between the vias, therefore this wiring technology is also called 1L/CH (one line per channel) wiring technology.

In FIG. 1b the reference planes for voltage and GND are shown. They are needed to provide the DC current, the AC return current and to shield against vertical coupling from plane pair to plane pair (e.g., $X_1/Y_1$ to $X_2/Y_2$ to $X_n/Y_n$, wherein $X_1 \ldots X_n$ and $Y_1 \ldots Y_n$ are successive signal wiring layers).

Finally, FIG. 1c shows the total cross-section of an MCM with all layers. The layer sequence shows 7 fan-out layers (redistribution layers RD1–RD7) on the top embedded in voltage and GND shield layers. The fan-out layers transform the dense chip footprint into a less dense via pattern which starts at the first plane pair $(X_1, Y_1)$. The redistribution layers are followed by 13 plane pairs (13 PP, $X_1/Y_1, \ldots, X_{13}/Y_{13}$) of signal wiring layers, which are again embedded in voltage and GND shield layers. The total MCM cross-section thereby consists of 62 layers of ceramic or glass ceramic.

Low-effective inductance ($L_{eff}$) is crucial for controlling package switching noise levels. The trend for VLSI is to place higher speed circuits at greater densities on a chip. The resultant need for more simultaneous switching mandates a better $L_{eff}$. Even though $L_{eff}$ will naturally reduce because of the lower on-chip impedances due to the higher circuit counts, it will still be necessary to augment this effect by placing high-frequency decoupling capacitors between associated voltage pins very close to each chip.

However, in view of either the layout of the wiring lines associated with the semiconductor chip or the physical dimensions of the discrete capacitor, the discrete capacitor cannot be positioned such that there is no voltage drop or noise at all.

FIG. 2 shows ground (GND) and voltage (V1) mesh planes and two associated signal wiring layers (X, Y). Also shown are the mesh conductors M1 and M2 on the GND- and the V1-plane, as well as the signal conductors C1 ... C4, located on signal distribution layer Y. As can be seen from this figure, the width of the mesh-plane (M1, M2) is identical to the width of the signal conductor (C1, C2). Due to an incomplete shielding effect the inductive and capacitive coupling (L/C) between signal conductors C1, C2 and C3, C4 is increased. This holds true also for the coupling between vertical and diagonal neighbors (C3, C4→C1, C2; cf. the arrows in FIG. 2). Thus, this structure generates an unbalanced and asymmetrical coupling at near end and far end.

Thus, there still exists a need in the art to provide a technology for the manufacturing of multilayered ceramic modules having an increased shielding effect as well as superior electrical properties compared to the state of the art structures.

SUMMARY OF THE INVENTION

The present invention relates to a method and apparatus to improve coupled noise characteristics and reduce the number of signal layers in a multilayer ceramic module (MCM). Toward this end, preferred embodiments of the present invention provide an increased via punch pitch, thus allowing two wiring channels between adjacent vias. The resultant increase in wirability allows a reduction in the number of signal layers, thereby reducing the total number of layers in the MCM. In addition, the preferred embodiments of the present invention provide voltage and ground mesh plane conductors which are wider than the signal conductors, thereby improving the coupled noise characteristics of the device.

It is therefore an object of the invention to provide a multilayer ceramic structure having superior electrical properties and an increased shielding effect combined with lower manufacturing costs due to reduction of layers.

These and other objects and advantages are achieved by the structure according to the appended claims.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may be best understood by reference to the following description taken in connection with the accompanying drawings in which:

FIG. 1a shows in top and side view the wiring scheme of the state-of-the-art MCM-MLC technology;

FIG. 1b depicts in top and side view the reference planes for voltage and GND for the structure given in FIG. 1a; the cross section shows the GND and the voltage mesh planes with the X, Y wiring plane pair in between;

FIG. 1c shows the total cross-section of an MCM with all layers according to the structure given in FIGS. 1a and 1b;

FIG. 2 depicts in top and side view ground (GND) and voltage (V1) mesh planes and two associated signal wiring layers (X, Y) of the structure of FIGS. 1a to 1c;

FIG. 3c shows the total cross-section of an MCM with all layers according to the structure given in FIGS. 3a and 3b, according to preferred embodiments of the present invention; and FIG. 4 depicts in a side view ground (GND) and voltage mesh planes and two associated signal wiring layers ($X_n$, $Y_n$ and $X_{n+1}$, $Y_{n+1}$) of the structure of FIGS. 3a to 3c, according to preferred embodiments of the present invention.

DETAILED DESCRIPTION OF THE PREFERRED EMBODIMENT

Figure 3A:
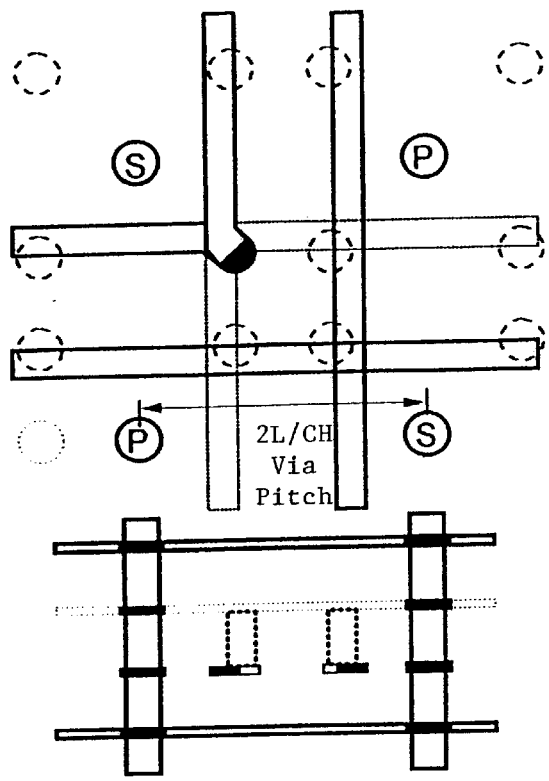
FIG. 3a shows in top and side view the wiring scheme of the MCM-MLC technology according to preferred embodiments of the present invention.
Figure 3B:
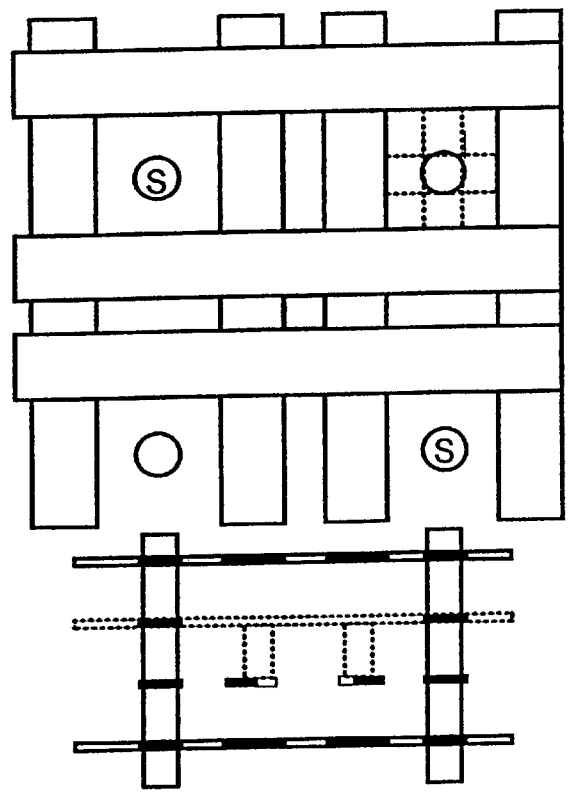
FIG. 3b depicts in top and side view the reference planes for voltage and GND for the structure given in FIG. 3a; the cross section shows the GND and the voltage mesh planes with the X, Y wiring plane pair in between, according to preferred embodiments of the present invention.

FIGS. 3a to 3c describe the novel MCM-MLC technology according to a preferred embodiment of the present invention. In FIG. 3a the wiring scheme is shown. It can be seen that the via pitch is now larger than the standard pitch in FIG. 1a. The signal and power vias (S, P) are punched through all multilayers (MLC) of the MCM. This new via punch pitch is now defined to fit two signal lines between the vias. In the given example the via punch pitch is 675 $\mu$m. However, the invention is not restricted to this value. One of ordinary skill in the art will readily deduce from the present disclosure that any via punch pitch can be used, provided two signal lines may be placed between the vias, and further provided that a reasonable manufacturing yield is attainable, as derived from the 1L/CH ground rules (i.e., approximately 50% yield or greater). The via punch pitch shown in FIG. 3a is much more relaxed than the standard via pitch and the signal line width and spacing is used according to the standard groundrules. Thereby the yield is not impacted. Due to the increase of wiring channels the wiring capacity of the wiring layers increases by 30% (Table 1).

The two wiring layers are again orthogonal to each other as in the standard technology. As two signal lines fit between the vias, the wiring technology of the present invention is now called 2L/CH (two lines per channel) wiring technology. It should be noted that, if the electrical conditions, e.g., coupled noise, allow the wiring of more than two lines per channel, the wiring technology disclosed herein can also be applied to three or more lines per channel.

In FIG. 3b the reference planes for voltage and GND are shown. These are slightly wider mesh lines compared to the standard MCM technology. The use of wider mesh lines improves the shield characteristic with respect to vertical coupling from plane pair to plane pair, as well as within the same wiring layer.

FIG. 3c shows the significant layer reduction achieved by using the 2L/CH wiring technology of the present invention. The total number of layers is reduced in this example by 24 layers, from 62 layers to 38 layers, due to the improved wiring capacity of the novel 2L/CH MCM-MLC technology.

This significant layer reduction also leads to a reduction in manufacturing costs of about 35% or more.

TABLE 1

| | state of the art product 1 L/CH wiring technology | novel product 2 L/CH wiring technology |
|---|---|---|
| outline size | 64.3 × 64.3 mm | 64.3 × 64.3 mm |
| channel area | 63.225 × 63.225 mm | 63.225 × 63.225 mm |
| via channels | 140 × 140 | 93 × 93 |

TABLE 1-continued

| | state of the art product 1 L/CH wiring technology | novel product 2 L/CH wiring technology |
|---|---|---|
| wiring channels | 142 × 142 | 189 × 189 |
| wiring capacity per layer per direction | 8978 mm | 11950 mm |
| wiring capacity [%] | 100% | 130% |

FIG. 4 depicts ground (GND) and voltage mesh planes and two associated signal distribution layers ($X_n$, $Y_n$ and $X_{n+1}$, $Y_{n+1}$) of the structure of FIGS. 3a to 3c. As already mentioned, and in addition to the enlarged via punch pitch all signal conductors C1 and C2 are overlapped by mesh conductors M1 and M2, respectively, by slightly increasing the width of the mesh plane so that the width of the mesh-plane (M1, M2) is now wider than the width of the conductor (C1, C2). This is achieved by using a respective screening mask having a greater mesh conductor width. The screening mask of the mesh planes is independent of the screening mask of the signal conductors. In the example given in FIG. 4 the overlap is about 10 μm. However, the invention is not restricted to this exact value but can be as small as 5 μm. Due to this overhang the shielding effect from conductor C1 to conductor C2 is improved and the coupling between direct neighbors is reduced. In addition, the shielding effect from conductors C3, C4 and C5 to conductor C2 is improved and the coupling between vertical and diagonal neighbors is reduced. Thus, this structure generates a balanced and symmetrical coupling at near end (NE) and far end (FE). This effect is shown in Table 2. The electrical properties (NE and FE coupled noise values) are superior to the state of the art structure, although the wiring density is increased by about 30%.

TABLE 2

| coupled noise voltage | state of the art 1 L/CH technology | novel 2 L/CH technology |
|---|---|---|
| $V_{fe}$ | 260 mV | 180 mV |
| $V_{nesat}$ @ 1.5 V | 120 mV | 180 mV |

The assumptions made in Table 2 are the following: 100 mm parallel lines, including via loading, 9 signal lines (1 quiet line (Q), 8 active (a) as depicted below), dV/dt=4 V/ns.

| X1 | a | a | a |
|---|---|---|---|
| X2 | a | Q | a |
| X3 | a | a | a |

Within a signal line arrangement 9 signal lines run 100 mm parallel in the same direction in three wiring layers (e.g., $X_1$, $X_2$, $X_3$ or $Y_1$, $Y_2$, $Y_3$, ... ). The center signal line (Q) is kept quiet and all surrounding lines are active (a) and switch simultaneously. The active lines have a slope of 4 V/ns.

The far end coupled noise voltage ($V_{fe}$) is significantly reduced as compared to the standard technology (260 mV→180 mV). The less critical near end noise voltage ($V_{nesat}$) is a little higher as compared to the state of the art technology (120 mV→180 mV).

In addition to the advantages already described, the novel 2L/CH MCM wiring technology of the present invention provides an additional advantage for the wiring of differential pairs. In the standard technology the adjacent wiring channels of the differential pairs must be kept free of wiring. In the novel MCM technology, however, this is not required anymore because of the closer coupling of adjacent tracks. Therefore, the wiring of differential pairs consumes less wiring channels as no neighbor channels have to be blocked. This results in a further enhancement of the wiring capacity.

A multilayer module according to the invention can be used to package the integrated circuit chips of a computer system. Such a computer system features improved reliability due to reduction of noise. Due to the higher and increased wiring capacity of 2L/CH, the line lengths in general become shorter. The cycle limiting net is shorter compared to the state of the art wiring technology. Therefore, a computer system using the present invention can be operated with faster clock frequencies.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A multilayer module for packaging at least one electronic component, said module comprising;

a plurality of electrically insulative layers;

a plurality of electrically conductive layers, each of said electrically conductive layers being disposed between subsequent ones of said electrically insulative layers, said electrically conductive layers forming;

mesh planes comprising mesh conductors, said mesh planes being either voltage mesh planes or ground mesh planes;

signal distribution layers comprising signal conductors, one or more of said signal distribution layers being disposed between said mesh planes, said mesh conductors being wider than said signal conductors;

signal and power vias, said vias forming conductive paths through said insulative layers and said conductive layers, said vias having a predetermined via pitch creating a plurality of wiring channels between adjacent ones of said vias on each of said conductive layers.

2. A multilayer module according to claim 1, wherein the width of said signal conductors is less than 80% of the width of said mesh conductors.

3. A multilayer module according to claim 1, wherein said mesh planes are of a gridlike shape.

4. A multilayer module according to claim 1, wherein said electrically insulative layers consist of ceramic material.

5. A multilayer module according to claim 1, wherein said electrically insulative layers consist of glass-ceramic material.

6. A multilayer module according to claim 1, wherein said electrically insulative layers consist of glass-epoxy.

7. A multilayer module according to claim 1, wherein said electrically insulative layers consist of teflon.

8. A multilayer module according to claim 1, wherein said electrically insulative layers consist of a flexible foil.

9. A multilayer module according to claim 1, wherein said signal conductors comprise at least one differential pair.

* * * * *

UNITED STATES PATENT AND TRADEMARK OFFICE
CERTIFICATE OF CORRECTION

PATENT NO. : 6,442,041 B2
DATED : August 27, 2002
INVENTOR(S) : Simone Rehm et al.

It is certified that error appears in the above-identified patent and that said Letters Patent is hereby corrected as shown below:

<u>Title page,</u>
Item [75], Inventors, "Bernd Garden" should read -- Bernd Garben --.

Signed and Sealed this

Thirtieth Day of September, 2003

JAMES E. ROGAN
*Director of the United States Patent and Trademark Office*